(12) United States Patent
Kuo et al.

(10) Patent No.: US 6,365,449 B1
(45) Date of Patent: Apr. 2, 2002

(54) PROCESS FOR MAKING A NON-VOLATILE MEMORY CELL WITH A POLYSILICON SPACER DEFINED SELECT GATE

(75) Inventors: Max C. Kuo, San Leandro; Etan Shacham, Cupertino, both of CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/657,882

(22) Filed: Sep. 8, 2000

Related U.S. Application Data
(60) Provisional application No. 60/152,758, filed on Sep. 8, 1999.

(51) Int. Cl.[7] .......................................... H01L 21/8249
(52) U.S. Cl. .................... 438/211; 438/229; 438/230; 438/257; 438/264; 438/275; 438/304
(58) Field of Search ................................ 438/211, 229, 438/230, 231, 232, 252, 264, 275, 304

(56) References Cited

U.S. PATENT DOCUMENTS

| | | | | |
|---|---|---|---|---|
| 5,655,632 A | * | 8/1997 | Valenbois | 188/136 |
| 5,780,341 A | * | 7/1998 | Ogura | 438/259 |
| 5,790,455 A | | 8/1998 | Caywood | |
| 5,986,931 A | | 11/1999 | Caywood | |
| 6,093,945 A | * | 7/2000 | Yang | 257/317 |
| 6,157,058 A | * | 12/2000 | Ogura | 257/315 |

* cited by examiner

*Primary Examiner*—Long Pham
(74) *Attorney, Agent, or Firm*—Townsend and Townsend and Crew LLP

(57) ABSTRACT

In accordance with an embodiment of the present invention, a method of forming a memory cell includes: forming a floating gate over a first portion of a silicon body region, the floating gate being insulated from the underlying first portion of the body region; forming a second layer polysilicon over the floating gate and a second portion of the body region, the second layer polysilicon being insulated from the underlying floating gate and the second portion of the body region; and forming a masking layer over the second layer polysilicon, the masking layer having a width along a first dimension parallel to the surface of the body region such that the masking layer extends over an entire width of the floating gate along the first dimension but does not extend beyond edges of steps of the second layer polysilicon formed due to the presence of the floating gate. Among many other advantages, such method provides a means of accurately controlling the cell channel length.

19 Claims, 1 Drawing Sheet

PROCESS FOR MAKING A NON-VOLATILE MEMORY CELL WITH A POLYSILICON SPACER DEFINED SELECT GATE

CROSS-REFERENCES TO RELATED APPLICATIONS

This application claims the benefit of U.S. Provisional Application No. 60/152,758, filed Sep. 8, 1999, the disclosure of which is incorporated by reference.

BACKGROUND OF THE INVENTION

This invention relates to semiconductor memories, and more particularly to a method of manufacturing and a structure of a split-gate non-volatile memory cell which provides a simple and highly accurate means of controlling the cell channel length which is a critical parameter for proper cell operation.

A conventional method of defining a select gate transistor in a non-volatile memory cell (e.g., in a split-gate cell) is to use a second layer polysilicon masking step along with a second layer polysilicon etching step. The masking and etching steps define a predetermined second layer polysilicon length and a corresponding portion of the cell channel length. The channel length of a split-gate cell is typically made-up of a portion under the floating gate plus another portion under the second polysilicon spacer side-wall.

As the channel length of split-gate cells continue to shrink in submicron technologies, it becomes increasingly difficult to accurately define the channel length because the polysilicon spacer side-wall starts to define a larger portion of the total channel length. For example, a deposited second layer polysilicon film with a thickness of 2,500 Å creates a spacer width of about 0.25 μm. If the total channel length target is 0.35 μm and the floating gate portion of the channel is 0.25 μm, it leaves the second layer polysilicon lithography step a misalignment tolerance relative to floating gate edges of a mere 0.05 μm.

In another case where the second polysilicon spacer width is 0.25 μm, if the target length for the portion of the channel length defined by the second polysilicon spacer is 0.2 μm, a very long over-etch is required to remove the twice-greater thickness of the second polysilicon film along the spacer region (the twice-greater thickness is caused by the step in second polysilicon due to the presence of the floating gate). This over-etch step, which is also carried out in the periphery CMOS region of the memory device wherein the twice-greater thickness of second polysilicon is not present, can severely pit the silicon in the source and drain junction regions of the periphery transistors. The silicon pitting causes an undesirable leakage current from the source and drain regions to the substrate. Further, such over-etch of the second layer polysilicon in the periphery CMOS regions makes the control of critical dimension (CD) in the periphery region more difficult. A solution to the CD control problem and the silicon pitting is to use a separate mask for etching of the second layer polysilicon in the periphery than that used in the array. But, the additional mask results in a more costly process.

Thus, a method of manufacturing and a structure of a non-volatile semiconductor memory cell which provides a simple and highly accurate means of controlling a sub-micron channel length, without requiring additional masking steps or over-etching of the second layer polysilicon film, is needed.

SUMMARY OF THE INVENTION

In accordance with an embodiment of the present invention, a method of forming a memory cell includes: forming a floating gate over a first portion of a silicon body region, the floating gate being insulated from the underlying first portion of the body region; forming a second layer polysilicon over the floating gate and a second portion of the body region, the second layer polysilicon being insulated from the underlying floating gate and the second portion of the body region; and forming a masking layer over the second layer polysilicon, the masking layer having a width along a first dimension parallel to the surface of the body region such that the masking layer extends over an entire width of the floating gate along the first dimension but does not extend beyond edges of steps of the second layer polysilicon formed due to the presence of the floating gate.

In one embodiment, the method further includes performing an etch cycle so that the portions of the second layer polysilicon not covered by the masking layer are etched back by an amount substantially equal to a predefined thickness of the second layer polysilicon.

In another embodiment, in a memory device having an array region and a periphery region, the second layer polysilicon in the array region also forms polysilicon gates of transistors in the periphery region, the etch cycle being designed to achieve a target critical dimension (CD) for a polysilicon gate length of the periphery transistors.

In another embodiment, the method further includes forming a source region and a drain region in the body region so that an inner edge of each of the source and drain regions is self-aligned to a corresponding outer edge of two second layer polysilicon spacers formed adjacent floating gate side-walls as a result of the etch cycle.

In another embodiment, a portion of the body region bounded by the source and drain regions forms a channel region having a channel length, a width of each of the second layer polysilicon spacers along the first dimension defining a corresponding portion of the channel length.

In another embodiment, the portions of the channel length corresponding to the spacers are symmetrical about the floating gate.

The following detailed description and the accompanying drawings provide a better understanding of the nature and advantages of the present invention.

DESCRIPTION OF THE SPECIFIC EMBODIMENTS

In accordance with the present invention, a method of manufacturing and a structure of a split-gate non-volatile memory cell provide a simple and highly accurate means of controlling the select-gate channel portion (and as a result the entire channel length) of the split-gate cell and the periphery polysilicon gate length, without requiring additional masking steps or over-etching of the second layer polysilicon film.

Figure 1A:
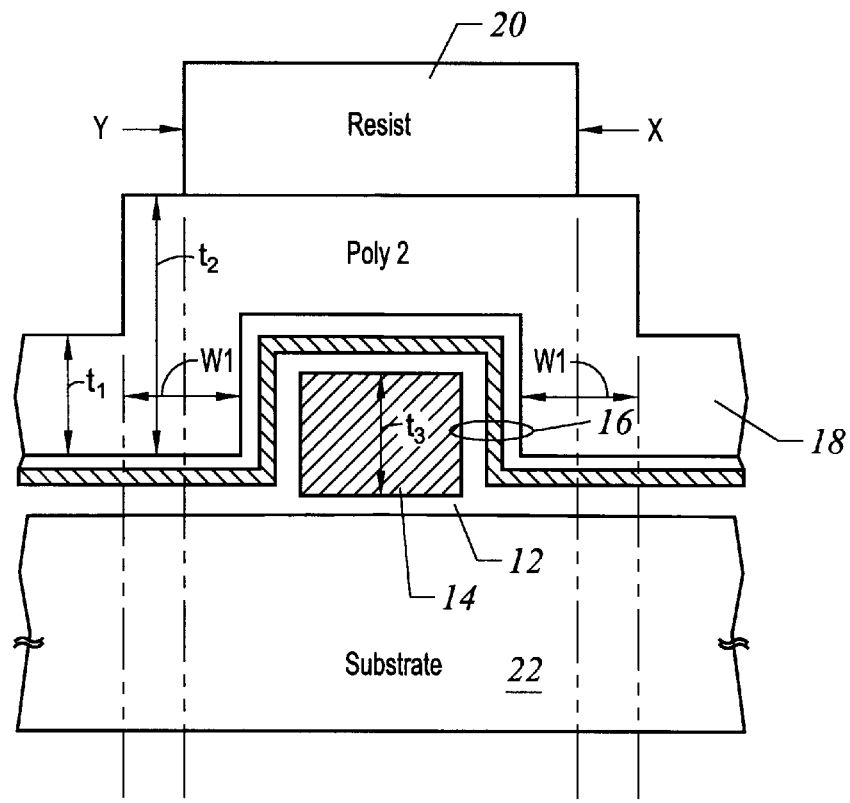
FIGS. 1A and 1B show cross sections of a split-gate non-volatile memory cell at different processing stages in accordance with an embodiment of the present invention.
Figure 1B:
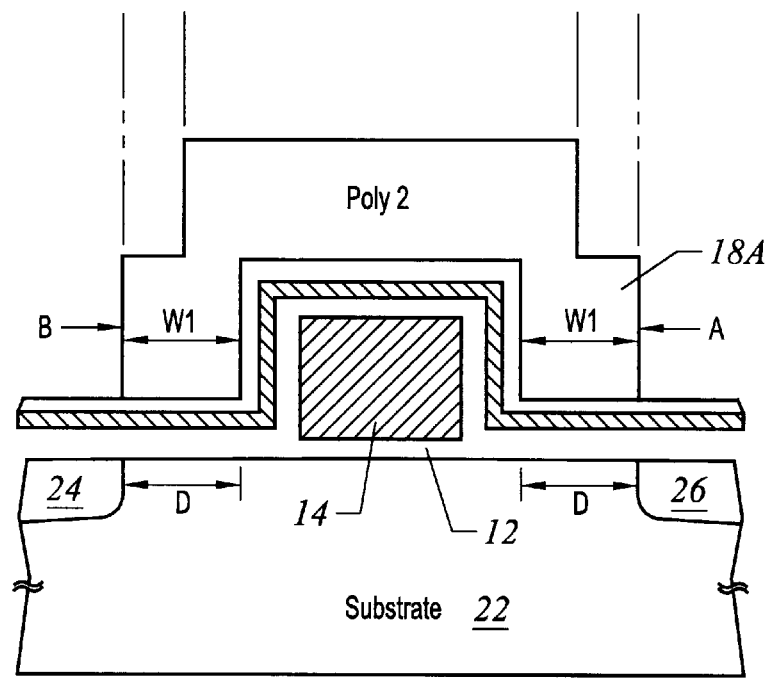

FIGS. 1A and 1B show cross sections of a split-gate non-volatile memory cell at different processing stages. Initially, in accordance with conventional processing techniques, the active area of the cell is defined and a tunnel oxide layer 12 having a thickness in the range of 70–100 Å, preferably about 85 Å, is grown over a substrate 22, as shown in FIG. 1A. Next, a first polysilicon layer is deposited and etched back using a masking layer to define a floating gate layer 14 having a thickness in the range of 1,000 Å to 3,000 Å, preferably about 1,500 Å. Floating gate layer 14 may be doped with one or more impurities to obtain the desired polysilicon characteristics.

An insulating composite layer 16 of oxide-nitride-oxide (ONO) is formed over floating gate 14 and other regions of the substrate, as shown in FIG. 1A. A second layer polysilicon 18 having a thickness $t_1$ in the range of 1,500 Å to 4,000 Å, preferably about 2,500 Å, is then deposited over the ONO composite layer 16 in accordance with conventional process steps. Second layer polysilicon 18 may be doped with one or more impurities to obtain the desired polysilicon characteristics.

Next, a photoresist masking layer 20 is formed over second layer polysilicon 18 as shown. Photoresist masking layer 20 is defined so that its outer right edge X and outer left edge Y are within the width W1 of the second polysilicon side walls as shown in FIG. 1A. Width W1 is equal to the thickness $t_1$ of second polysilicon 18. This feature of the present invention helps achieve a channel length which is perfectly symmetrical about floating gate 14, as will be more clearly shown and described in reference to FIG. 1B.

Next, a second layer polysilicon etch step is carried out. This etch step is optimized to achieve the desired critical dimensions (CDs) for the polysilicon gate length in the CMOS periphery area and not the array region. This is because in submicron technologies it is highly critical to accurately define the polysilicon gates of CMOS transistors in the periphery region. In the array region, this etch step results in removal of the portions of the second layer polysilicon 18 not covered by photoresist 20, such that polysilicon layer 18A remains as shown in FIG. 1B. The second layer polysilicon 18A forms a polysilicon spacer on the side-walls of floating gate 14.

The polysilicon spacer portions are shown as steps in FIG. 1B for simplicity, although in practice the spacers have smoother edges. The spacers are formed as a result of the requirement that the edges X, Y of photoresist 20 be within the width W1. This technique takes advantage of the physical feature of the cell where second polysilicon 18 has a thickness $t_2$ along the side-walls of floating gate 14 which is about equal to the target thickness $t_1$ of the second polysilicon plus the thickness $t_3$ of floating gate 14. This technique makes the alignment of second polysilicon masking layer 20 relative to floating gate 14 substantially more relaxed than in the prior art cells because the same second polysilicon side-wall width W1 (FIG. 1B) is formed regardless of the alignment as long as sides X and Y of masking layer 20 are within the W1 tolerance.

Next, photoresist mask 20 is removed, and source and drain regions 24 and 26 are formed in accordance with conventional processing steps. For example, an implant step whereby n-type impurities are implanted into the source/drain regions may be carried out. In such implant step, the outer edges of the second polysilicon spacers, marked as A and B in FIG. 1B, define the inner edges of source and drain regions 24 and 26. The inner edges of the source and drain regions in turn define the total channel length (i.e., the substrate surface region between source/drain diffusions 24, 26). Thus, the source and drain regions 24, 26 are self-aligned with the second layer polysilicon, yielding a more scalable memory cell.

Accordingly, the portions of the channel length marked as D are defined by the second polysilicon spacer width, which in turn is controlled by the thickness of the deposited second layer polysilicon 18. If portions D of the channel length are desired to be longer, a thicker second layer polysilicon may be chosen, and vice versa, if portions D are desired to be shorter, a thinner second layer polysilicon may be chosen. The length of the remaining portion of the channel (i.e., the portion other than portions D), is set primarily by the length of floating gate 14. The portions of the cell structure corresponding to the channel length portion D form the select gate transistor portions of the memory cell. Thus, the memory cell in FIG. 1B includes two select gate transistors, one to the right of the floating gate and one to the left of the floating gate.

As can be seen from FIGS. 1A and 1B, the edges X, Y of photoresist layer 20 may be off the center of width W1 by a certain amount (e.g., by a little less than one half of W1) without harming the cell structure or characteristics. That amount is dependent upon the thickness of the second layer polysilicon. If a thicker polysilicon layer is used, edges X, Y can be off the center of W1 by a larger amount than if a thinner polysilicon layer is selected. Thus, the misalignment tolerance for photoresist layer 20 relative to floating gate 14 is proportional to the thickness of the second layer polysilicon, i.e., the thicker the second layer polysilicon, the larger is the misalignment tolerance.

Thus, by making the cell channel length dependent upon the thickness of the second layer polysilicon, a simpler and a more accurate means of defining and controlling the cell channel length (specially for submicron channel lengths) is provided than conventional approaches. Further, a fully self-aligned drain and source regions are achieved. Also, by allowing the second layer polysilicon etch cycle to be fully optimized based on the CD targets for the CMOS periphery, first, the silicon pitting and the resulting undesirable leakage in the periphery region is eliminated, and second, more control is provided in defining the highly critical gate length of CMOS transistors. All this is achieved without requiring any additional masking steps.

While various alternate embodiments of the present invention have been disclosed, it should be evident that the present invention is equally applicable by making appropriate modifications to the embodiments described above. For example, the method of manufacturing and the structure of the memory cell of the present invention can be modified to form a n-type or p-type memory cell, or to form alternate structures of split-gate cells. Therefore, the above description should not be taken as limiting the scope of invention which is defined by the metes and bounds of the appended claims.

What is claimed is:

1. A method of forming a semiconductor memory cell, comprising:

forming a floating gate over a first portion of a silicon body region, the floating gate being insulated from the underlying first portion of the body region;

forming a second layer polysilicon over the floating gate and a second portion of the body region, the second layer polysilicon being insulated from the underlying floating gate and the second portion of the body region; and forming a masking layer over the second layer polysilicon, the masking layer having a width along a first dimension parallel to the surface of the body region such that the masking layer extends over an entire width of the floating gate along the first dimension but does not extend beyond edges of steps of the second layer polysilicon formed due to the presence of the floating gate.

2. The method of claim 1 further comprising:
performing an etch cycle so that the portions of the second layer polysilicon not covered by the masking layer are etched back by an amount substantially equal to a predefined thickness of the second layer polysilicon.

3. The method of claim 2 wherein in a memory device having an array region and a periphery region, the second layer polysilicon in the array region also forms polysilicon gates of transistors in the periphery region, the etch cycle being designed to achieve a target critical dimension (CD) for a polysilicon gate length of the periphery transistors.

4. The method of claim 2 further comprising:
forming a source region and a drain region in the body region so that an inner edge of each of the source and drain regions is self-aligned to a corresponding outer edge of two second layer polysilicon spacers formed adjacent floating gate side-walls as a result of the etch cycle.

5. The method of claim 4 wherein a portion of the body region bounded by the source and drain regions forms a channel region having a channel length, a width of each of the second layer polysilicon spacers along the first dimension defining a corresponding portion of the channel length.

6. The method of claim 5 wherein the portions of the channel length corresponding to the spacers are symmetrical about the floating gate.

7. The method of claim 1 further comprising:
forming a composite layer of oxide-nitride-oxide over the floating gate and the second portion of the body region to insulate the second layer polysilicon from the underlying floating gate and second portion of the body region.

8. The method of claim 1 further comprising:
forming a tunnel oxide layer over the first region of the body region to insulate the floating gate from the underlying first region of the body region.

9. The method of claim 1 wherein the masking layer is a photoresist layer.

10. The method of claim 1 wherein the semiconductor memory cell is a split-gate memory cell.

11. The method of claim 1 wherein the semiconductor memory cell is a flash memory cell.

12. The method of claim 4 wherein the body region is a p-type silicon substrate, and the source and drain regions are n-type.

13. The method of claim 4 wherein the body region is a n-type well region in a p-type substrate and the source and drain regions are p-type.

14. A method of forming a semiconductor memory cell, comprising:
forming a floating gate over a first portion of a silicon body region, the floating gate being insulated from the underlying first portion of the body region;
forming a second layer polysilicon over the floating gate and a second portion of the body region, the second layer polysilicon being insulated from the underlying floating gate and the second portion of the body region; and
forming a masking layer over the second layer polysilicon, a width of the masking layer along a first dimension parallel to the surface of the body region being greater than a width of the floating gate along the first dimension but smaller than a width of the second layer polysilicon along the first dimension, the width of the second layer polysilicon being defined by the portion of the second layer polysilicon over the floating gate and bounded by outer edges of second layer polysilicon steps formed due to the presence of the floating gate.

15. The method of claim 14 further comprising:
performing an etch cycle so that the portions of the second layer polysilicon not covered by the masking layer are etched back by an amount substantially equal to a predefined thickness of the second layer polysilicon.

16. The method of claim 15 wherein in a memory device having an array region and a periphery region, the second layer polysilicon in the array region also forms polysilicon gates of transistors in the periphery region, the etch cycle being designed to achieve a target critical dimension (CD) for a polysilicon gate length of the periphery transistors.

17. The method of claim 15 further comprising:
forming a source region and a drain region in the body region so that an inner edge of each of the source and drain regions is self-aligned to a corresponding outer edge of two second layer polysilicon spacers formed adjacent floating gate side-walls as a result of the etch cycle.

18. The method of claim 17 wherein a portion of the body region bounded by the source and drain regions forms a channel region having a channel length, a width of each of the second layer polysilicon spacers along the first dimension defining a corresponding portion of the channel length.

19. The method of claim 18 wherein the portions of the channel length corresponding to the spacers are symmetrical about the floating gate.

\* \* \* \* \*